US011798571B2

(12) United States Patent
Koizumi et al.

(10) Patent No.: US 11,798,571 B2
(45) Date of Patent: Oct. 24, 2023

(54) ACOUSTIC SIGNAL PROCESSING APPARATUS, METHOD AND PROGRAM FOR THE SAME

(71) Applicant: NIPPON TELEGRAPH AND TELEPHONE CORPORATION, Tokyo (JP)

(72) Inventors: Yuma Koizumi, Tokyo (JP); Noboru Harada, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 300 days.

(21) Appl. No.: 17/413,504

(22) PCT Filed: Dec. 2, 2019

(86) PCT No.: PCT/JP2019/046934
§ 371 (c)(1),
(2) Date: Jun. 11, 2021

(87) PCT Pub. No.: WO2020/121860
PCT Pub. Date: Jun. 18, 2020

(65) Prior Publication Data
US 2022/0059115 A1 Feb. 24, 2022

(30) Foreign Application Priority Data

Dec. 14, 2018 (JP) .................................. 2018-234185

(51) Int. Cl.
*G10L 21/0232* (2013.01)
(52) U.S. Cl.
CPC ................. *G10L 21/0232* (2013.01)

(58) Field of Classification Search
CPC .................................................. G10L 21/0232
See application file for complete search history.

(56) References Cited

U.S. PATENT DOCUMENTS

2002/0061075 A1* 5/2002 Dartois ..................... H04L 5/06
375/316
2005/0154689 A1* 7/2005 Rising, III ............. G06N 3/084
706/15

OTHER PUBLICATIONS

Erdogan et al. (2015) "Phase-sensitive and recognition-boosted speech separation using deep recurrent neural networks" Proc. ICASSP, Apr. 19, 2015.

(Continued)

*Primary Examiner* — Ibrahim Siddo (57) ABSTRACT

Provided is an acoustic signal processing technique for performing a signal transformation suitable for desired signal processing (e.g., sound source enhancement processing) on a signal, and then performing the desired signal processing on the transformed signal. An acoustic signal processing device performs signal processing M which is a desired target on an input acoustic signal x. The acoustic signal processing device includes a transform unit that performs transform processing P on the acoustic signal x to obtain a first transform coefficient X; a signal processing unit that performs signal processing M corresponding to a desired target on the first transform coefficient X to obtain a second transform coefficient ^S; and an inverse transform unit that performs inverse transform processing $P^{-1}$ on the second transform coefficient ^S to obtain an acoustic signal ^s subjected to signal processing which is a desired target, wherein the transform processing P, the inverse transform processing $P^{-1}$, and the signal processing M are simultaneously optimized.

15 Claims, 4 Drawing Sheets

(56) References Cited

OTHER PUBLICATIONS

Koizumi et al. (2018) "Trainable Adaptive Window Switchingfor Speech Enhancement" [online] Accessed on Nov. 5, 2018, website: https://arxiv.org/pdf/1811.02438v1.pdf.

* cited by examiner

ACOUSTIC SIGNAL PROCESSING APPARATUS, METHOD AND PROGRAM FOR THE SAME

CROSS-REFERENCE TO RELATED APPLICATIONS

This application is a U.S. 371 Application of International Patent Application No. PCT/JP2019/046934, filed on 2 Dec. 2019, which application claims priority to and the benefit of JP Application No. 2018-234185, filed on 14 Dec. 2018, the disclosures of which are hereby incorporated herein by reference in their entireties.

TECHNICAL FIELD

The present invention relates to a technique for performing signal analysis using a signal transformation (e.g., short-time Fourier transform (STFT)) on an audio/acoustic signal, and then performing desired signal processing (e.g., voice enhancement processing) on the transformed signal.

BACKGROUND ART

There is known a conventional technique for performing signal analysis using the STFT and performing sound source enhancement processing on acoustic signals in frequency domain.

In order to perform acoustic signal processing, it is first necessary to observe the sound using a microphone. The observed sound contains noise in addition to the target sound to be processed. The sound source enhancement refers to signal processing that extracts a target sound from an observation signal containing noise.

The sound source enhancement is now defined. Suppose that an observation signal of the microphone is $x_k$, and $x_k$ is also a mixed signal of a target sound signal $s_k$ and a noise signal $n_k$ as represented in the following formula:

$$x_k = s_k + n_k \tag{1}$$

where k is an index of time in time domain. In order to extract the target sound from the observation signal, consider analyzing sets of observation signals in time domain in which the sets are for every K points and each set includes signals for L points. Then, suppose that the sets of observation signals a t-th signal ($t \in \{0, \ldots, T\}$) is represented as $$x_t = (x_{tK+1}, \ldots, x_{tK+L})^T \tag{2}$$

which is referred to as an observation signal in a t-th frame. Here, $^T$ represents transpose. Then, the observation signal in the t-th frame can be expressed using Formula (1) as follows:

$$x_t = s_t + n_t \tag{3}$$

Here, $$s_t = (s_{tK+1}, \ldots, s_{tK+L})^T$$

$$n_t = (n_{tK+1}, \ldots, n_{tK+L})^T$$

In the time-frequency analysis of signals using the STFT, the STFT is applied to the observation signal in each time frame. The signal after the STFT satisfies the following properties.

[Math. 1]

$$\underline{STFT[x_t]}_{X_t^{(STFT)}} = \underline{STFT[s_t]}_{S_t^{(STFT)}} + \underline{STFT[n_t]}_{N_t^{(STFT)}} \tag{4}$$

Here, $X_t^{(STFT)} = (X_{t,1}^{(STFT)}, \ldots, X_{t,L}^{(STFT)})^T$, $S_t^{(STFT)} = (S_{t,1}^{(STFT)}, \ldots, S_{t,L}^{(STFT)})^T$, and $N_t^{(STFT)} = (N_{t,1}^{(STFT)}, \ldots, N_{t,L}^{(STFT)})^T$ are analysis results obtained as results of performing STFT on the observation signal, the target sound signal, and the noise signal in the t-th frame, respectively.

Time-frequency mask processing is one of the typical methods in the sound source enhancement. In this processing, the time-frequency mask $G_t = (G_{t,1}, \ldots, G_{t,L})$ is multiplied by the observation signal after the STFT, so that an estimated value of the target sound signal after the STFT is calculated as follows.

[Math. 2]

$$\hat{S}_t^{(STFT)} = G_t \odot X_t^{(STFT)} \tag{5}$$

[Math. 3]

where the symbol of a dot within a circle is Hadamard product.

Finally, an estimated value of the target sound signal in time domain is obtained by performing the inverse STFT (ISTFT) on $\hat{S}_t^{(STFT)}$ as in the following formula.

$$\hat{s}_t = ISTFT[\hat{S}_t^{(STFT)}] \tag{6}$$

Now suppose that H is a function with a parameter $\theta_G$ for estimating $G_t$ from the observation signal. Then, $G_t$ is defined as follows.

$$G_t = H(x_t | \theta_G) \tag{7}$$

Note that, in the sound source enhancement using deep learning, which has been actively studied in recent years, a method of designing H by a deep neural network (DNN) is the mainstream. In the following, it is assumed that H is implemented using a DNN. Accordingly, from Formulas (5) and (6), $\hat{S}_t^{(STFT)}$ and $\hat{s}^t$ can be described as follows.

[Math. 4]

$$\hat{S}_t^{(STFT)} = \underline{H(x_t | \theta_G) \odot X_t^{(STFT)}}_{M(x_t^{(STFT)} | \theta_M)} \tag{8}$$

[Math. 5]

$$\hat{s}_t = ISTFT[M(X_t^{(STFT)} | \theta_M)] \tag{9}$$

In this case, $\theta_M = \theta_G$. From Formula (9), the unknown parameter of the sound source enhancement based on the time-frequency mask processing in STFT domain is $\theta_M$. Since the purpose of the sound source enhancement is to extract the target sound from the observation signal, $\theta_M$ may be obtained so as to minimize an objective function $J(\theta_M)$ for $\theta_M$ that defines an extraction error.

[Math. 6]

$$\theta_M \leftarrow \underset{\theta_M}{\mathrm{argmin}} J(\theta_M) \tag{10}$$

Here, the objective function can use, for example, a phase-sensitive error, which is a squared error between the complex spectrum of the target sound and the complex spectrum of the time-frequency masked sound (see NPL 1):

$$J^{PSF}(\theta_M) = E[\|S_t - M(X_t|\theta_M)\|_2^2]_t \quad (11)$$

or an average absolute error of the signal after the ISTFT:

$$J^{E2E}(\theta_M) = E[\|s_t - \hat{s}_t\|_1]_t \quad (12)$$

Here, $\|\cdot\|_p$ represents an $L_p$ norm and $E[\cdot]_t$ represents an expected value for t.

CITATION LIST

Non Patent Literature

[NPL 1] H. Erdogan, J. R. Hershey, S. Watanabe, and J. L. Roux, "Phase-sensitive and recognition-boosted speech separation using deep recurrent neural networks", in Proc. ICASSP, 2015.

SUMMARY OF THE INVENTION

Technical Problem

The STFT is a mapping function from a real number to a complex number. That is, $$\text{STFT}: R^L \mapsto C^L \quad [\text{Math. 7}]$$

Therefore, in order to handle the signal after the STFT, it is necessary to operate complex numbers. In the sound source enhancement, the time-frequency mask $G_t$ also needs to be a complex number in order to completely reconstruct the target sound signal from the observation signal. However, due to the difficulty of handling the complex number, $G_t$ is mostly estimated as a real number in a classical algorithm such as the spectral subtraction method, and in the time-frequency mask estimation using deep learning. That is, only the amplitude spectrum is operated, not the phase spectrum.

The recent research development for complete reconstruction of signals has the following two approaches:
1. The phase spectrum is also estimated by sophisticating processing M.
2. The sound source enhancement is performed in real number domain not STFT domain.

A typical study of the former is to estimate a phase spectrum from a time-frequency masked amplitude spectrum in a post-processing manner, which is typified by the Griffin-Lim algorithm (see Reference Document 1).
[Reference Document 1] D. W. Griffin and J. S. Lim, "Signal estimation from modified short-time Fourier transform", IEEE Trans. Acoust. Speech Signal Process., 32, pp. 236-243 (1984).

In addition, there is a method of directly estimating a complex time-frequency mask using deep learning (see Reference Document 2).
[Reference Document 2] D. S. Williamson, Y. Wang and D. L. Wang, "Complex ratio masking for monaural speech separation", IEEE/ACM Transactions on Audio, Speech, and Language Processing, pp. 483-492, 2016.

The latter study originates from an idea that the STFT is conventionally used as a frequency transformation but there is no reason why the frequency transformation has to be the STFT. Rather, the STFT, which is complex transformation to which existing machine learning algorithms are difficult to apply, may not be a frequency transformation suitable for signal processing using deep learning. Therefore, in recent years, studies have been conducted using a frequency transformation defined in real number domain such as the modified discrete cosine transform (MDCT) instead of the STFT (see Reference Document 3).
[Reference Document 3] Y. Koizumi, N. Harada, Y. Haneda, Y. Hioka, and K. Kobayashi, "End-to-end sound source enhancement using deep neural network in the modified discrete cosine transform domain", In Proc. ICASSP, 2018.

An object of the present invention is to provide an acoustic signal processing device, a method therefor, and a program, which perform a signal transformation suitable for desired signal processing (e.g., sound source enhancement processing) on a signal, and then perform the desired signal processing on the transformed signal.

Means for Solving the Problem

In order to solve the problems described above, an acoustic signal processing device according to one aspect of the present invention performs signal processing M which is a desired target on an input acoustic signal x. The acoustic signal processing device includes a transform unit that performs transform processing P on the acoustic signal x to obtain a first transform coefficient X; a signal processing unit that performs signal processing M corresponding to a desired target on the first transform coefficient X to obtain a second transform coefficient $\hat{S}$; and an inverse transform unit that performs inverse transform processing $P^{-1}$ on the second transform coefficient $\hat{S}$ to obtain an acoustic signal $\hat{s}$ subjected to signal processing which is a desired target, wherein the transform processing P, the inverse transform processing $P^{-1}$, and the signal processing M are simultaneously optimized.

Effects of the Invention

According to the present invention, a signal transformation suitable for desired signal processing is performed on a signal and then the desired signal processing is performed on the transformed signal, so that an advantageous effect is provided that can improve the accuracy of the desired signal processing.

DESCRIPTION OF EMBODIMENTS

Hereinafter, embodiments of the present invention will be described. Note that in the drawings used in the following description, the same reference numerals are given to components having the same function and steps for performing the same processing, and duplicate description is omitted. In the following description, the symbol "^" or the like used in the text should be set immediately above the character immediately after correctly, but due to the limitation of the text notation, it is set immediately before the character. In formulas, such symbols are set in their original positions.

Further, unless otherwise specified, processing performed for each element of a vector or a matrix is applied to all the elements of the vector or the matrix.

<Points of Present Embodiment>

Conventionally, in audio/acoustic signal processing with or without deep learning, it is rare to handle a waveform as it is, and in many cases, an observation signal is subjected to the Fourier transform (STFT) for each short time section, and the signal is subjected to enhancement and identification. However, the STFT is a transform from a real number to a complex number, and for deep learning using complex numbers, it makes the learning complicated. Therefore, only the amplitude information of an STFT spectrum is often used or controlled. This means that the information on the phase spectrum is ignored. As a result, it cannot be said that information obtained from the observation signal is fully utilized. The present embodiment originates from an idea that there is no longer any reason why the frequency transformation has to be the STET. So far, modified discrete cosine transform (MDCT) has been used instead of the STFT. The present embodiment is based on an idea that the "transform" no longer has to be a fixed function such as the STFT and the MDCT, but rather the "transform" is also to be designed as an optimizable function if compatibility with audio/acoustic signal processing is considered, and is to be simultaneously optimized with an objective function for training a neural network for audio/acoustic signal processing. In order to realize the simultaneous optimization, the "transform" may be designed with a neural network that can be subjected to an inverse transform so that the transform and the neural network for audio/acoustic signal processing can simultaneously execute error back propagation.

<Outline of Present Embodiment>

In the present embodiment, the STFT is treated to be extended to a general mapping function P having an inverse transform (hereinafter, also referred to as a transformation function P). Then, Formula (9) can be described as follows.

$$\hat{s}_t = P^{-1}[M(P[x_t]|\theta_M)] \quad (13)$$

Note that P can also use identity mapping, which is a method of performing sound source enhancement in time domain. In that case, M is not time-frequency masking, but a DNN that directly outputs a waveform, such as WaveNet, is used (see Reference 4).

Reference 4: K. Qian, Y. Zhang, S. Chang, X. Yang, D. Florencio, and M. H. Johnson, "Speech enhancement using Bayesian wavenet", in Proc. INTERSPEECH, 2017.

In the present embodiment, sound source enhancement corresponds to extended acoustic signal processing using a transform other than the STFT in which "2. The sound source enhancement is performed in real number domain not STFT domain" described above. So far, P has been considered as a fixed transform such as the STFT or the MDCT. However, thinking more flexibly, P does not even have to be a fixed transform, but rather P is also to be designed as an optimizable function with a parameter $\theta_P$ if compatibility with the signal processing M is considered, and is to be simultaneously optimized with the same objective function as $\theta_M$. That is, $$P[x|\theta_P]: x \mapsto X \text{ and } P^{-1}[X|\theta_P]: X \mapsto x \quad \text{[Math. 8]}$$

and, Formula (13) is extended as follows.

$$\hat{s}_t = P^{-1}[M(P[x_t|\theta_P])|\theta_M)|\theta_P] \quad (14)$$

[Math. 9]

$$\theta \leftarrow \operatorname*{argmin}_{\theta} J(\theta) \quad (15)$$

Here, $\theta = \{\theta_M, \theta_P\}$. The objective function $J(\theta)$ is, for example, a phase sensitive error or an average absolute error, represented by Formula (11) or (12), respectively.

In the present embodiment, a transformation function P having an inverse transform, which is not necessarily a frequency transformation, is defined, and its parameters are simultaneously optimized with the same objective function as parameters of a function M that performs acoustic signal processing such as a sound enhancement function. Here, the forms of P and M is not particularly limited, but a learning example of designing P using a neural network will be described.

(Learning Example)

An example of designing P using a neural network will be described. For the sake of simplicity, a one-layer fully-connected neural network (FCN) is used as the neural network. First, a square matrix $W \in R^{L \times L}$, a bias vector $b \in R^L$, and a non-linear transformation $$\sigma(x): R^L \mapsto R^L. \quad \text{[Math. 10]}$$

are defined. Then, P and its inverse function can be described as follows.

$$P(x|\theta_P) = \sigma(Wx + b) = X \quad (16)$$

$$P^{-1}(X|\theta_P) = W^{-1}[\sigma^{-1}(X) - b] = x \quad (17)$$

Conditions for the above transform to hold are that W is regular (i.e., having an inverse matrix) and that $\sigma(x)$ has an inverse transform. First, a learning method of W in which the regularity of W is guaranteed will be described. In general FCN optimization, the regularity of W is not guaranteed. In the present embodiment, in order to guarantee this, learning of W is performed in which the regularity is guaranteed in a manner that performs matrix decomposition that holds only when the matrix is regular o W, and optimizes the matrix after the matrix decomposition. Examples of such matrix decomposition include an LU decomposition, a QR decomposition, and a Cholesky decomposition. According to the present embodiment, W may be subjected to any decomposition, but here, the following matrix decomposition is treated.

$$W = Q(AA^T + \varepsilon E) \quad (18)$$

Here, $Q \in R^{L \times L}$ is a regular matrix, $A \in R^{L \times L}$ is a square matrix, E is an L×L identity matrix, and $\varepsilon > 0$ is a regularization parameter. In Formula (18), W is always a regular matrix no matter what value A takes. Therefore, W is trained by training A using a gradient method or the like. Note that other values are fixed without change. In the present embodiment, for example, Q is a DCT matrix (discrete cosine transform matrix), and the initial value of A is also a DCT matrix. Accordingly, $AA^T$ is a unit matrix for the initial value, and thus the initial value of W becomes $(1+\varepsilon)$ times of the DCT matrix. Then, $(AA^T + \varepsilon E)$ continues to change as the training progresses, and as a result, W becomes a regular matrix which is a transformation of the DCT matrix.

Next, in terms of $\sigma(x)$, this can use an existing activation function having an inverse transform. A sigmoid function or a tan h function can be considered for such $\sigma(x)$, but those having an exponential function or a logarithmic function in the operation tend to have their inverse transform and derivative numerically unstable. Therefore, $\sigma(x)$ is preferably designed as a piecewise linear function. Such $\sigma(x)$ includes, for example, the following leaky-ReLU.

$$\sigma(x)=\max(x,\alpha x) \tag{19}$$

$$\sigma^{-1}(x)=\min(x,\alpha^{-1}x) \tag{20}$$

where $0<\alpha<1$. It is obvious that P designed in this way is differentiable with respect to $\theta_P$, and $J(\theta)$, which is a composite function containing P, is also differentiable with respect to $\theta_P$ and $\theta_M$. Therefore, the parameters $\theta_P$ and $\theta_M$ for transform and acoustic signal processing can be simultaneously learned by the error back propagation method so as to satisfy Formula (15).

Now, in the above example, a single layer FCN is used for simplicity, but obviously this can be extended to a multi-layer FCN. A transform when the FCN of Q layers is used is shown below.

$$P(x|\theta_P)=\sigma_Q(W_Q \ldots \sigma_2(W_2(\sigma_1(W_1 x+b_1))+b_2) \ldots b_Q) \tag{21}$$

$$P^{-1}(X|\theta_P)=W^{-1}_1[\sigma^{-1}_1( \quad \ldots \quad W^{-1}_{Q-1}[\sigma^{-1} Q_{-1} \\ (W^{-1}_Q[\sigma^{-1}_Q(X)-b_Q])-b_{Q-1}] \ldots)-b_1] \tag{22}$$

A design is also possible using a convolution neural network (CNN) capable of inverse transform instead of the FCN. For that, for example, a structure such as RevNet (see Reference 5) may be used.

Reference 5: A. N. Gomez, M. Ren, R. Urtasun, and R. b. Grosse, "The reversible residual network: Backpropagation without storing activations", in Proc. NIPS, 2017.

In other words, P may be any function as long as it is designed with a neural network capable of inverse transform, so that the parameters $\theta_P$ and $\theta_M$ of transform and acoustic signal processing can be simultaneously learned by the error back propagation method so as to satisfy Formula (15).

<Details of First Embodiment>

An acoustic signal processing system according to the first embodiment includes a learning device and an acoustic signal processing device.

The learning device and the acoustic signal processing device are each a special device that is configured by loading a special program into a known or dedicated computer including, for example, a central processing unit (CPU), a main storage device (RAM: Random Access Memory), or the like. The learning device and the acoustic signal processing device execute each step of processing under the control of the central processing unit, for example. Data input to the learning device and the acoustic signal processing device and data obtained by each step of processing are stored in the main storage device, for example, and the data stored in the main storage device is read to the central processing unit as needed so that it is used for other steps of processing. At least a part of each processing unit of the learning device and the acoustic signal processing device may be composed of hardware such as an integrated circuit. Each storage unit included in the learning device and the acoustic signal processing device can be composed of, for example, a main storage device such as a RAM (Random Access Memory) or middleware such as a relational database or a key-value store. However, each storage unit does not necessarily have to be provided inside the learning device and the acoustic signal processing device, and may be composed of an auxiliary storage device including semiconductor memory elements such as a hard disk, an optical disk, or a flash memory, so that it is provided outside the learning device and the acoustic signal processing device.

First, the learning device will be described.

<Learning Device>

Figure 1:
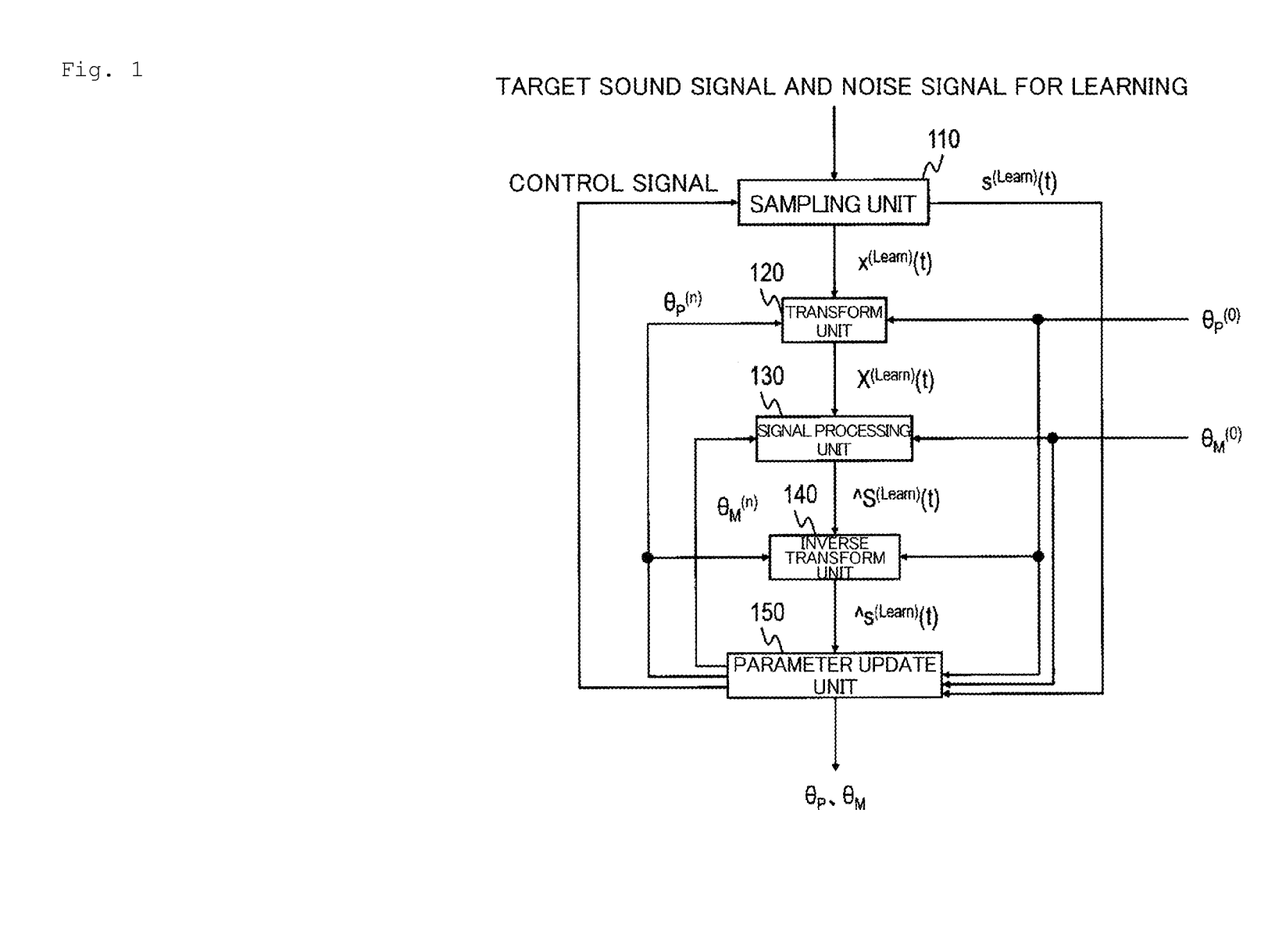
FIG. 1 is a functional block diagram of a learning device according to a first embodiment.
Figure 2:
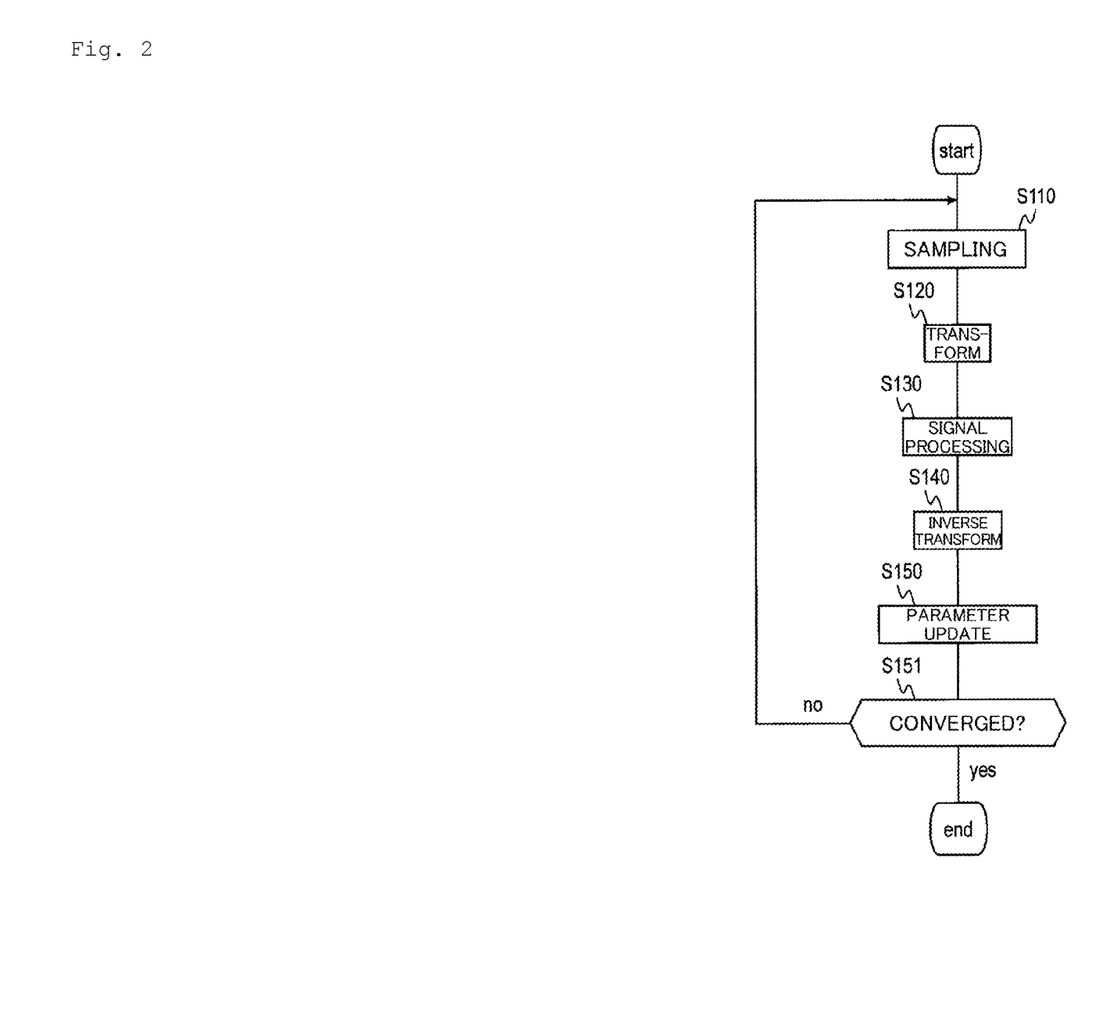
FIG. 2 illustrates an example of a processing flow of the learning device according to the first embodiment.

FIG. 1 illustrates a functional block diagram of the learning device according to the first embodiment, and FIG. 2 illustrates a processing flow thereof.

The learning device includes a sampling unit 110, a transform unit 120, a signal processing unit 130, an inverse transform unit 140, and a parameter update unit 150.

The learning device inputs a target sound signal for learning, a noise signal for learning, and parameters required for various optimizations, trains and outputs the parameters $\theta_P$ and $\theta_M$. The parameters required for various optimizations include initial values $\theta_P^{(0)}$ and $\theta_M^{(0)}$ of the parameters $\theta_P$ and $\theta_M$. Here, the signal processing M may be defined by a fully connected neural network, a long short-term memory (LSTM) network, or the like. The transform processing P may be defined by the network that can be subjected to an inverse transform as described in "Learning example". Further, some random numbers or the like may be used as the initial values $\theta_P^{(0)}$ and $\theta_M^{(0)}$ of the parameters $\theta_P$ and $\theta_M$. The initial value $\theta_P^{(0)}$ is set in the transform unit 120 and the inverse transform unit 140, and the initial value $\theta_M^{(0)}$ is set in the signal processing unit 130. Further, the parameters $\theta_P$ and $\theta_M$ to be updated is set as the initial values $\theta_P^{(0)}$ and $\theta_M^{(0)}$ in the parameter update unit 150.

Hereinafter, each unit of the learning device will be described.

<Sampling Unit 110>

The sampling unit 110 receives input of target sound signals and noise signals for learning, randomly selects a target sound signal and a noise signal (S110), superimposes the target sound signal and the noise signal to simulate an observation signal, and then outputs the observation signal $x^{(Learn)}(t)$ of the simulation result. For example, $$x^{(Learn)}(t)=s^{(Learn)}(t)+n^{(Learn)}(t)$$

Here, $n^{(Learn)}(t)$ is a noise signal for learning. Also, the sampling unit 110 outputs the target sound signal $s^{(Learn)}(t)$ corresponding to the observation signal $x^{(Learn)}(t)$ to the parameter update unit 150.

<Transform Unit 120>

The transform unit 120 receives input of the observation signal $x^{(Learn)}(t)$ and a parameter $\theta_P^{(n-1)}$, performs the transform processing P based on the parameter $\theta_P^{(n-1)}$ on the observation signal $x^{(Learn)}(t)$ to obtain a first transform coefficient $X^{(Learn)}(t)$ (S120), and outputs the first transform coefficient $X^{(Learn)}(t)$. For example, when the FCN of Q layers is used, the observation signal $X^{(Learn)}(t)$ is transformed into the first transform coefficient $X^{(Learn)}(t)$ by the following formula.

$$X^{(Learn)}(t)=P(x^{(Learn)}(t)|\theta_P^{(n-1)})=\sigma_Q(W_Q \ldots \sigma_2(W_2(\sigma_1(W_1 x^{(Learn)}(t)+b_1))+b_2) \ldots b_Q)$$

For example, for Q=1, $$X^{(Learn)}(t)=P(x^{(Learn)}(t)|\theta_P^{(n-1)})=\sigma_1(W_1 x^{(Learn)}(t)+b_1)$$

Here, n represents the number of updates of the parameters $\theta_P^{(n)}$, and the first transform coefficient $X^{(Learn)}(t)$ is obtained using the parameter $\theta_P^{(n-1)}$ obtained in one previous update processing. Note that in the first update processing, the transform processing P based on the initial value $\theta_P^{(0)}$ is performed.

<Signal Processing Unit 130>

The signal processing unit 130 receives input of the first transform coefficient $X^{(Learn)}(t)$ and a parameter $\theta_M^{(n-1)}$, performs the signal processing M corresponding to a desired target based on the parameter $\theta_M^{(n-1)}$ on the first transform coefficient $X^{(Learn)}(t)$ to obtain a second transform coefficient $\hat{}S^{(Learn)}(t)$ (S130), and outputs the second transform coefficient $\hat{}S^{(Learn)}(t)$. In the present embodiment, sound source enhancement processing is performed as the signal processing.

$$\hat{}S^{(Learn)}(t)=M(X^{(Learn)}(t)|\theta_M^{(n-1)})$$

Note that in the first update processing, the signal processing M based on the initial value $\theta_M^{(0)}$ is performed.

<Inverse Transform Unit 140>

The inverse transform unit 140 receives input of the second transform coefficient $\hat{}S^{(Learn)}(t)$ and a parameter $\theta_P^{(n-1)}$, performs inverse transform processing $P^{-1}$ based on the parameter $\theta_P^{(n-1)}$ on the second transform coefficient $\hat{}S^{(Learn)}(t)$ to obtain an acoustic signal $\hat{}s^{(Learn)}(t)$ subjected to the signal processing which is the desired target (S140), and outputs the acoustic signal $\hat{}s^{(Learn)}(t)$. For example, when the FCN of Q layers is used, the second transform coefficient $\hat{}S^{(Learn)}(t)$ is transformed into the acoustic signal $\hat{}s^{(Learn)}(t)$ by the following formula.

$$\hat{}s^{(Learn)}(t)=P^{-1}(\hat{}S^{(Learn)}(t)|\theta_P)$$

$$=W^{-1}{}_1[\sigma^{-1}{}_1(\quad\ldots\quad W^{-1}{}_{Q-1}[^{-1}{}_{Q-1}(W^{-1}{}_Q[\sigma^{-1}Q$$
$$(\hat{}S^{(Learn)}(t))-b_Q])-b_{Q-1}]\ldots)-b_1]$$

For example, for Q=1, $$\hat{}^{(Learn)}(t)=P^{-1}(\hat{}S^{(Learn)}(t)|\theta_P=W^{-1}{}_1(\sigma^{-1}{}_1$$
$$(\hat{}S^{(Learn)}(t))-b_1$$

Note that in the first update processing, the transform processing P based on the initial value $\theta_P^{(0)}$ is performed.

<Parameter Update Unit 150>

The parameter update unit 150 receives input of the acoustic signal $\hat{}s^{(Learn)}(t)$ and a target sound signal $s^{(Learn)}(t)$, and updates $\theta_P^{(n-1)}$ and $\theta_M^{(n-1)}$ based on the values of the signals so as to achieve a high evaluation on the objective function J to obtain parameters $\theta_P^{(n)}$ and $\theta_M^{(n)}$ (S150). For example, in a case where a smaller value of the objective function $J(\theta)$ means a higher evaluation, the parameter $\theta^{(n-1)}$ is updated by the following formula.

[Math. 11]

$$\theta \leftarrow \arg\min_\theta J(\theta) \qquad (15)$$

In a case where the signal processing M corresponding to the desired target is sound source enhancement processing, $J(\theta)$ is, for example, $$J(\theta)=E[\|s^{(Learn)}(t)-\hat{}s^{(Learn)}(t)\|_1]_t$$

As a learning method so as to minimize Formula (15), for example, a stochastic steepest descent method or the like may be used, and the learning rate may be set to about $10^{-5}$. Note that, as the parameters $\theta_P^{(n-1)}$ and $\theta_M^{(n-1)}$ before the update, the parameters updated at one previous update and stored in a storage unit (not illustrated) may be used. Also, as the parameters before the update at the first update processing, the initial values $\theta_P^{(0)}$ and $\theta_M^{(0)}$ may be used.

Further, the parameter update unit 150 determines whether or not the parameters have converged, and if they have not converged (no in S151), outputs the updated parameters $\theta^{(n)}=(\theta_P^{(n)}, \theta_M^{(n)})$, and then S110 to S150 are repeated. The parameter update unit 150 outputs $\theta_P^{(n)}$ to the transform unit 120 and the inverse transform unit 140, $\theta_M^{(n)}$ to the signal processing unit 130, and a control signal to instruct the repetition of processing to the sampling unit 110.

On the other hand, if the parameters have been converged (yes in S151), the parameter $\theta^{(n)}$ at that time is output as optimized parameters $\theta=(\theta_P, \theta_M)$, and then the learning ends. Any rule may be used as the convergence test rule. For example, a rule can be used that the number of repetitions of S110 to S150 exceeds a certain number of times N (N>N?).

Next, the acoustic signal processing device that performs acoustic signal processing using the parameter $\theta$ will be described.

<Acoustic Signal Processing Device>

Figure 3:
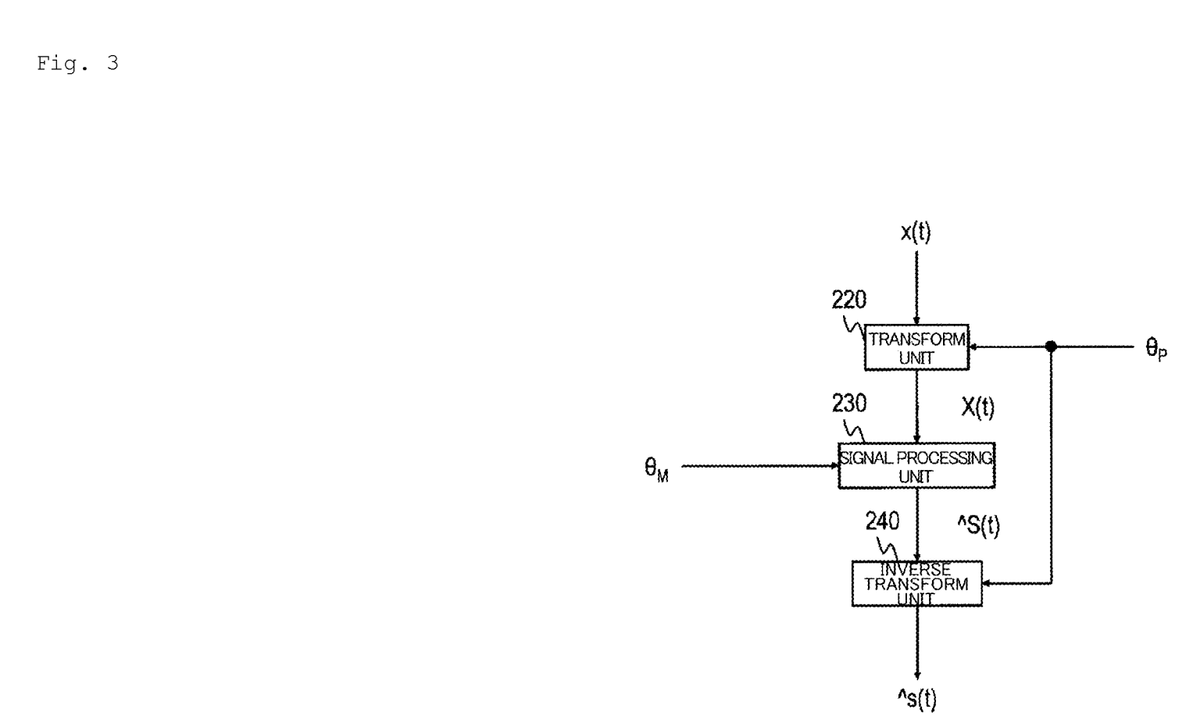
FIG. 3 is a functional block diagram of an acoustic signal processing device according to the first embodiment.
Figure 4:
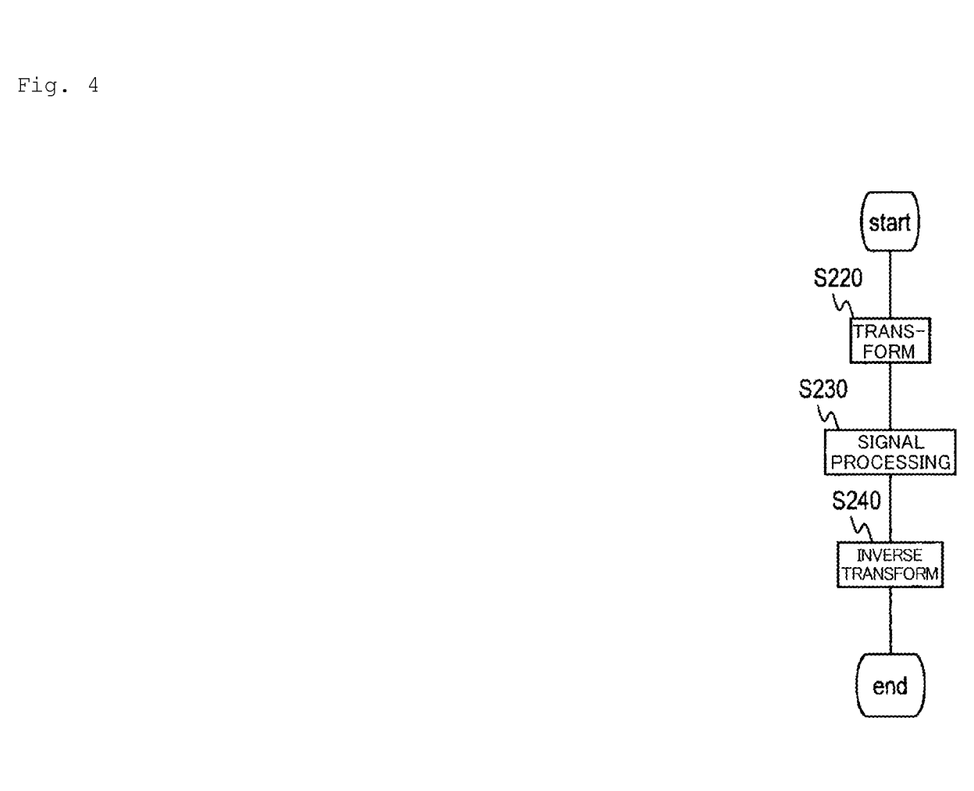
FIG. 4 illustrates an example of a processing flow of the acoustic signal processing device according to the first embodiment.

FIG. 3 illustrates a functional block diagram of the acoustic signal processing device according to the first embodiment, and FIG. 4 illustrates a processing flow thereof.

The acoustic signal processing device includes a transform unit 220, a signal processing unit 230, and an inverse transform unit 240.

Prior to the desired signal processing, the acoustic signal processing device receives input of the parameters $\theta=(\theta_P, \theta_M)$ trained by the learning device, sets the parameter $\theta_P$ in the transform unit 220 and the inverse transform unit 240, and sets the parameter $\theta_M$ in the signal processing unit 230.

The acoustic signal processing device receives inputs of the observation signal x(t) on which the signal processing is to be performed, performs the desired signal processing, and outputs a processing result (the acoustic signal $\hat{}s(t)$ subjected to sound source enhancement processing).

Hereinafter, each unit of the acoustic signal processing device will be described.

<Transform Unit 220>

The transform unit 220 receives input of the observation signal x(t), performs transform processing P based on the parameter $\theta_P$ on the observation signal x(t) to obtain a first transform coefficient X(t) (S220), and outputs the first transform coefficient X(t). The content of the transform processing P is the same as that of the transform unit 120.

<Signal Processing Unit 230>

The signal processing unit 230 receives input of the first transform coefficient X(t), performs signal processing M corresponding to a desired target based on the parameter $\theta_M$ on the first transform coefficient X(t) to obtain a second transform coefficient $\hat{}S(t)$ (S230), and outputs the second transform coefficient $\hat{}S(t)$. The content of the signal processing M is the same as that of the signal processing unit 130.

<Inverse Transform Unit 240>

The inverse transform unit 240 receives input of the second transform coefficient $\hat{}S(t)$, performs inverse transform processing $P^{-1}$ based on the parameter $\theta_P$ on the second transform coefficient $\hat{}S(t)$ to obtain an acoustic signal $\hat{}s(t)$ subjected to the signal processing which is the desired target (S240), and outputs the acoustic signal $\hat{}s(t)$. The content of the inverse transform processing $P^{-1}$ is the same as that of the inverse transform unit 140.

Advantageous Effect

With the above configuration, a signal transformation suitable for desired signal processing is performed on a signal and then the desired signal processing is performed on the transformed signal, so that it is possible to improve the accuracy of the desired signal processing.

MODIFIED EXAMPLES

In the present embodiment, an example in which the desired signal processing is sound enhancement processing is taken, but the present invention is applicable to other acoustic signal processing. The applicable acoustic signal processing is anything as long as it is processing to be performed after signal analysis (e.g., STFT or MDCT) of sound and to provide some kind of evaluation. For example, it is applicable to voice section estimation processing, sound source direction estimation processing, sound source position estimation processing, noise suppression processing, noise cancelling processing, voice recognition processing, voice synthesis processing, and the like. In the learning device, the same objective function may be used to simultaneously update the signal analysis parameters and the acoustic signal processing parameters so as to achieve a high evaluation. It may be for providing not only an evaluation from the difference or the degree of agreement between a correct value (actual target sound signal s) and an estimated value (acoustic signal ^s, that is, estimated target sound signal) as in the present embodiment but also any evaluation on a processing result of acoustic signal processing. For example, as signal processing which is the desired target, voice synthesis processing may be performed to evaluate whether the synthesized voice as the processing result is natural in hearing and then to update parameters using the evaluation. Here, the evaluation may be given manually (e.g., five levels of evaluation indicating whether the synthetic voice is natural in hearing), or may be given automatically by an evaluation system based on some index.

In the present embodiment, an example of designing the transform processing P with a neural network is taken, but other structures may be used. For example, it may be designed by using a linear transformation or the like. In short, it may be anything as long as it has the inverse transform processing $P^{-1}$.

In the present embodiment, an example in which the signal processing M is defined by a fully connected neural network, a long short-term memory (LSTM: Long Short Term Memory) network, or the like is taken, but there is no particular limitation and the transform processing may be anything as long as it is simultaneously updated (optimized) with the transform processing P by using the same objective function.

Other Modified Example

The present invention is not limited to the above embodiment and modified examples. For example, the various types of processing described above may not only be executed in chronological order according to the description, but may also be executed in parallel or individually as required or depending on the processing capacity of the device that executes the processing. In addition, changes can be made as appropriate without departing from the spirit and scope of the present invention.

<Program and Recording Medium>

Further, the various types of processing functions in the devices described in the embodiment and modified examples described above may be implemented by a computer. In that case, the processing content of the function that each device needs to have is described by a program. Then, by executing this program on a computer, various processing functions of the above-described devices are implemented on the computer.

The program describing the processing content can be recorded in a computer-readable recording medium. The computer-readable recording medium may be anything, for example, a magnetic recording device, an optical disc, a magneto-optical recording medium, or a semiconductor memory.

Further, the distribution of this program is performed by selling, transferring, or lending a portable recording medium such as a DVD or a CD-ROM in which the program is recorded. Furthermore, the program may be stored in a storage device of a server computer so that the program can be distributed by being transferred from the server computer to another computer via a network.

A computer that executes such a program first stores, for example, the program recorded on a portable recording medium or the program transferred from the server computer in its own storage unit. Then, when processing is executed, the computer reads the program stored in its own storage unit and executes the processing according to the read program. Further, as another embodiment of this program, a computer may read the program directly from a portable recording medium and execute the processing according to the program. Furthermore, each time the program is transferred from the server computer to this computer, the processing according to the received program may be executed sequentially. In addition, a configuration may be provided in which a so-called ASP (Application Service Provider) service, which implements the processing functions only by an instruction of execution and acquisition of the result without transferring the program from the server computer to this computer, executes the above-described processing. Note that the program includes information used for processing by a computer and equivalent to the program (e.g., data that is not a direct command to the computer but has a property of defining processing on the computer).

Further, although each device is implemented by executing a predetermined program on a computer, at least a part of these processing contents may be realized by hardware.

The invention claimed is:

1. An acoustic signal processing apparatus for performing signal processing M which is a desired target on an input acoustic signal x, the acoustic signal processing apparatus comprising:
   a transformer configured to transform processing P on the acoustic signal x to obtain a first transform coefficient X;
   a signal processor configured to perform signal processing M corresponding to a desired target on the first transform coefficient X to obtain a second transform coefficient ^S; and
   an inverse transformer configured to transform inverse transform processing $P^{-1}$ on the second transform coefficient ^S to obtain an acoustic signal ^s subjected to signal processing which is a desired target, wherein the transform processing P, the inverse transform processing $P^{-1}$, and the signal processing M are simultaneously optimized.

2. The acoustic signal processing apparatus according to claim 1, wherein the transform processing P is optimized under a constraint of having inverse transform processing $P^{-1}$.

3. The acoustic signal processing apparatus according to claim 2, wherein the transform processing P, the inverse transform processing $P^{-1}$, and the signal processing M are optimized with a same objective function J.

4. The acoustic signal processing apparatus according to claim 3, wherein a parameter of the transform processing P is $\theta_P$, and the first transform coefficient X is $P[x|\theta_P]$, a parameter of the signal processing M is $\theta_M$, the second transform coefficient ^S is $M(P[x|\theta_P]|\theta_M)$, an acoustic signal $\hat{s}^{(Learn)}$ obtained by performing the signal processing M which is the desired target on an acoustic signal $x^{(Learn)}$ for learning is $P^{-1}$ [M(P[x|θ$_P$]|θ$_M$)|θ$_P$], and θ$_P$ and θ$_M$ are optimized based on the acoustic signal $\bar{\ }s^{(Learn)}$ so as to achieve a high evaluation on the objective function J.

5. The acoustic signal processing apparatus according to claim 4, wherein the transform processing P and the inverse transform processing $P^{-1}$ are each defined by a matrix, and the transform processing P and the inverse transform processing $P^{-1}$ are matrixes obtained by optimizing decomposition matrixes in which the defined matrixes are decomposed according to a predetermined rule.

6. An acoustic signal processing method of performing signal processing M which is a desired target on an input acoustic signal x, the acoustic signal processing method comprising:
    transforming, by a transformer, processing P on the acoustic signal x to obtain a first transform coefficient X;
    processing, by a signal processor, signal processing M corresponding to a desired target on the first transform coefficient X to obtain a second transform coefficient $\hat{S}$; and
    transforming, by an inverse transformer, inverse transform processing $P^{-1}$ on the second transform coefficient $\hat{S}$ to obtain an acoustic signal $\hat{s}$ subjected to signal processing which is a desired target, wherein the transform processing P, the inverse transform processing $P^{-1}$, and the signal processing M are simultaneously optimized.

7. The acoustic signal processing method according to claim 6, wherein the transform processing P is optimized under a constraint of having inverse transform processing $P^{-1}$.

8. The acoustic signal processing method according to claim 7, wherein the transform processing P, the inverse transform processing $P^{-1}$, and the signal processing M are optimized with a same objective function J.

9. The acoustic signal processing method according to claim 8, wherein a parameter of the transform processing P is θ$_P$, and the first transform coefficient X is P[x|θ$_P$], a parameter of the signal processing M is θ$_M$, the second transform coefficient $\hat{S}$ is M(P[x|θ$_P$]|θ$_M$), an acoustic signal $\hat{s}^{(Learn)}$ obtained by performing the signal processing M which is the desired target on an acoustic signal $x^{(Learn)}$ for learning is $P^{-1}$ [M(P[x|θ$_P$]|θ$_M$)|θ$_P$], and θ$_P$ and θ$_M$ are optimized based on the acoustic signal $\hat{s}^{(Learn)}$ so as to achieve a high evaluation on the objective function J.

10. The acoustic signal processing method according to claim 9, wherein the transform processing P and the inverse transform processing $P^{-1}$ are each defined by a matrix, and the transform processing P and the inverse transform processing $P^{-1}$ are matrixes obtained by optimizing decomposition matrixes in which the defined matrixes are decomposed according to a predetermined rule.

11. A computer-readable non-transitory recording medium storing computer-executable program instructions that when executed by a processor to cause a computer system to:
    transforming, by a transformer, processing P on the acoustic signal x to obtain a first transform coefficient X;
    processing, by a signal processor, signal processing M corresponding to a desired target on the first transform coefficient X to obtain a second transform coefficient $\hat{S}$; and
    transforming, by an inverse transformer, inverse transform processing $P^{-1}$ on the second transform coefficient $\hat{S}$ to obtain an acoustic signal $\hat{s}$ subjected to signal processing which is a desired target, wherein the transform processing P, the inverse transform processing $P^{-1}$, and the signal processing M are simultaneously optimized.

12. The computer-readable non-transitory recording medium according to claim 11, wherein the transform processing P is optimized under a constraint of having inverse transform processing $P^{-1}$.

13. The computer-readable non-transitory recording medium according to claim 12, wherein the transform processing P, the inverse transform processing $P^{-1}$, and the signal processing M are optimized with a same objective function J.

14. The computer-readable non-transitory recording medium according to claim 13, wherein a parameter of the transform processing P is θ$_P$, and the first transform coefficient X is P[x|θ$_P$], a parameter of the signal processing M is θ$_M$, the second transform coefficient $\hat{S}$ is M(P[x|θ$_P$]|θ$_M$), an acoustic signal $\hat{s}^{(Learn)}$ obtained by performing the signal processing M which is the desired target on an acoustic signal $x^{(Learn)}$ for learning is $P^{-1}$ [M(P[x|θ$_P$]|θ$_M$)|θ$^P$], and θ$^P$ and θ$_M$ are optimized based on the acoustic signal $\hat{s}^{(Learn)}$ so as to achieve a high evaluation on the objective function J.

15. The computer-readable non-transitory recording medium according to claim 14, wherein the transform processing P and the inverse transform processing $P^{-1}$ are each defined by a matrix, and the transform processing P and the inverse transform processing $P^{-1}$ are matrixes obtained by optimizing decomposition matrixes in which the defined matrixes are decomposed according to a predetermined rule.

* * * * *